United States Patent [19]

Mills et al.

[11] Patent Number: 5,684,752
[45] Date of Patent: Nov. 4, 1997

[54] PIPELINED READ ARCHITECTURE FOR MEMORY

[75] Inventors: Duane R. Mills; Sachidanandan Sambandan; Phillip M. L. Kwong, all of Folsom, Calif.

[73] Assignee: Intel Corporation, Santa Clara, Calif.

[21] Appl. No.: 724,270

[22] Filed: Sep. 18, 1996

Related U.S. Application Data

[62] Division of Ser. No. 575,339, Dec. 20, 1995, Pat. No. 5,592,435, which is a continuation of Ser. No. 254,028, Jun. 3, 1994, abandoned.

[51] Int. Cl.$^6$ .................................................. G11C 8/04
[52] U.S. Cl. .......................... 365/230.03; 365/233.5; 365/189.05
[58] Field of Search .................... 365/233.5, 230.03, 365/189.05, 220, 185.33, 233

[56] References Cited

U.S. PATENT DOCUMENTS

| | | | |
|---|---|---|---|
| 4,715,017 | 12/1987 | Iwahashi | 365/230.08 |
| 4,785,428 | 11/1988 | Bajwa et al. | 365/233 |
| 5,257,235 | 10/1993 | Miyamoto | 365/230.03 |
| 5,297,148 | 3/1994 | Harari et al. | 371/10.2 |
| 5,306,963 | 4/1994 | Leak et al. | 365/233.5 |
| 5,325,502 | 6/1994 | McLaury | 395/425 |
| 5,475,634 | 12/1995 | Wang | 365/189.05 |
| 5,517,461 | 5/1996 | Unno | 365/189.05 |

FOREIGN PATENT DOCUMENTS 2 251 324   7/1992   United Kingdom .

OTHER PUBLICATIONS

Dipert, Brian, "28F008SA Hardware Interfacing", Intel Corporation's *Mobile Computer Products: Chapter 4*, Application Note AP-359, Aug. 1992, pp. 4-299 to 4-309.

Dipert, Brian and Marcus Levy, "Chapter 5: Hardware Interfacing to Flash Memory Components", *Designing With Flash Memory: The definitive guide to designing flash memory hardware and software for components and PCM-CIA cards*, Annabooks: San Diego, CA, Oct. 1993, pp. i–vii and 73—104.

Dipert, Brian, "Flash Memory: Meeting the Needs of Mobile Computing", Intel Corporation's *Flash Memory Volume II: Chapter 10*, Article Reprint AR-715, 1992, pp. 10–8 to 10–15.

"Flash Memory Overview", Intel Corporation's *Flash Memory Volume I: Chapter 2*, Nov. 1992, pp. 2–1 to 2–6.

Prince, Betty, "Memory in the Fast Lane", *IEEE Spectrum*, Feb. 1994, pp. 38–41.

Sama, Anil and Brian Dipert, "Power Supply Solutions for Flash Memory", Intel Corporation's *Flash Memory Volume I: Chapter 2*, application Note AP-357, Sep. 1993, pp. 2–7 to 2–41.

Verner, Don, "Implementing Mobile PC Designs Using High Density FlashFile Components", Intel Corporation's *Flash Memory Volume I: Chapter 3*, Application Note AP-362, Oct. 1993, pp. 3–139 to 3–193.

*Primary Examiner*—A. Zarabian
*Attorney, Agent, or Firm*—Blakely, Sokoloff, Taylor & Zafman

[57] ABSTRACT

A memory device having a memory array is described. The memory device has a sensing stage to sense data stored within the memory array. The memory device also has an output stage to output the data stored within the memory array that has been sensed by the sensing stage. The sensing stage and the output stage are separated so that data associated with a first address within the memory array can be sensed while data associated with a second address within the memory array can be output.

12 Claims, 6 Drawing Sheets

PIPELINED READ ARCHITECTURE FOR MEMORY

CROSS-REFERENCE TO RELATED APPLICATIONS

This application is a divisional of application 08/575,339, filed Dec. 20, 1995 (now U.S. Pat. No. 5,592,435), which is a continuation of application Ser. No. 08/254,028, filed Jun. 3, 1994 (now abandoned).

FIELD OF THE INVENTION

The present invention pertains to the field of computer systems. More particularly, the present invention relates to reading memory locations within computer systems.

BACKGROUND OF THE INVENTION

Typically, the heart of a personal computer system is a central processing unit (CPU) that resides on a microprocessor chip. New microprocessor chips that operate at increasingly high operating speeds are constantly being developed in order to permit personal computers to execute large programs and process large data files in a timely manner.

If the next instruction to be executed is not available when the microprocessor needs it, then the microprocessor typically must wait idly (i.e. insert wait cycles) while the required instruction is retrieved and provided to the microprocessor. Furthermore, if the next instruction to be executed requires data that is not immediately available to the microprocessor, the microprocessor must also idle until the data has been retrieved. Therefore, many modern high performance microprocessors have an internal cache. Instructions that are likely to be executed, and data that are likely to be needed by the executing instructions, are stored in the internal cache so that they may be accessed immediately by the CPU of the microprocessor.

Because the internal cache is typically filled a cache line at a time, many microprocessors can accept data in a burst mode. In a typical burst read, the microprocessor specifies the addresses of the data or instructions to be read into a cache line. Then, the data or instructions that are stored at the specified addresses are sent from where they are stored within the computer system to the microprocessor. Alternately, the microprocessor specifies a single address of the cache line, then the addresses of the rest of the cache line are calculated and the data at these locations are sent to the microprocessor.

Typically, an address is specified as a single monolithic address and each bit of the address is specified on its own address bit line. An address valid signal is provided with the address to signify that a valid address is being asserted on the address lines. Alternately, the number of address lines can be reduced by dividing an address into parts and then multiplexing the address parts on the address lines. For example, a single address can map into a row and column address pair. The row and column addresses then share the same set of address lines. Typically, row and column address strobe signals are provided to indicate respectively when a valid row or column address is placed on the shared address lines.

A high speed microprocessor chip typically interfaces with the rest of the computer system using at least one high speed bus to access fast (low latency) devices. Examples of devices that typically are coupled to the high speed bus include the main memory of the computer system and an external memory cache.

A computer system also typically has a relatively low speed bus to access slow (high latency) devices. Some microprocessor can interface directly with the low speed bus. Alternately, the low speed bus is coupled to the high speed bus using a bus bridge. One type of device that is typically coupled to the low speed bus uses flash memory. Flash memory typically is a high-density, nonvolatile, read-write memory. Examples of flash memory based devices include BIOS ROM and hard disk substitutes. The read operation associated with a typical flash memory array closely resembles the read operation associated with other read-only memory devices. Write and erase operations for a flash memory array are, however, significantly slower than the read operation.

British patent document no. GB 2 251 324 A, published Jul. 1, 1992, describes a computer system that uses flash memory. The patent document discloses various architectures to incorporate a flash memory into a computer system. One architecture referred to therein is a variable file structure. For the variable file structure, computer code is stored contiguously in flash memory, allowing a CPU to execute computer code directly from the flash memory array without the need for RAM.

Thus, flash memory can serve as the main memory within computers, providing user functions similar to those of disk-based systems. For example, by storing application software and operating system code in a Resident Flash Array (RFA), users enjoy virtually instant-on performance and in-place code execution. An RFA also protects against software obsolescence because, unlike ROM, it is in-system updatable. Resident software, stored in flash rather than disk, extends battery life and increases system reliability. File management software such as Microsoft's Flash File System (FFS) allows flash memory components and flash cards to emulate the file storage capabilities of disk thereby making the management of flash memory devices completely transparent to the user.

During a typical read operation for a flash memory device, an address corresponding to a location within the device to be read is sent to the device. The address is then decoded into a row and column address pair. This row and column address pair corresponds to a set of flash memory cells within a flash memory array that contain the data stored at the address to be read. These cells are then sensed to determine the value of the data stored within them. Finally, the data that has been sensed is output from the flash device.

Address transition detection ("ATD") is also well known in the art and has been widely used in memory devices. The purpose of address transition detection circuitry is to increase the speed with which data can be read from memory. This is accomplished by performing operations that are required for every memory read operation as soon as an address transition has been detected.

These operations include equalizing sense amplifiers and latching the previous output. The sense amplifiers are used to increase weak signals sensed from the memory cells to be read during the read operation. Equalizing the sense amplifiers causes the amplifiers to be cleared or otherwise set up so that they are ready to process the new data to be read. Latching the previous output causes the output to remain static until the new data from the read operation has been output from the sense amplifiers. The previous output is latched because the output of the sense amplifiers fluctuates before it finally reaches a steady value. Latching the previous output ensures that the swing does not pass down to the outputs. Circuitry to equalize the sense amplifiers and latch previous output is well known in the art.

Flash memory typically has an asynchronous interface wherein an address to be read is specified and then, a set time later, the contents stored at the specified address are output from the flash chip. It is only after the data has been output from the flash chip that the next address to be read can be sent to the flash chip. A high speed bus can run at 33 MHz wherein every cycle of the bus takes about 30 nanoseconds (nS). A typical high speed flash chip, on the other hand, has a read access time of about 80 nS. Hence, if flash memory is to be used as main memory, every single memory access to flash involves wait states and zero wait state back to back burst cycles from flash cannot be supported. This is true for other devices having a read latency similar to that of flash memory. Thus, using prior art technology, it is not practical to use these memories as main memory for a high speed microprocessor.

SUMMARY AND OBJECTS OF THE INVENTION

Therefore, one object of the present invention is to provide an efficient memory hierarchy based on non-volatile memory versus volatile memory wherein both data and applications are stored in random access nonvolatile memory and further wherein applications are executed directly from the random access non-volatile memory.

It is also an object of this invention to enable flash memory to be read using an optimal pipelined architecture so that the CPU can execute programs directly out of the flash memory without any degradation in performance when compared to volatile memory based main memory.

It is also an object of this invention is to enable flash memory to be read using an optimal pipelined architecture wherein the reading of separate banks of flash memory is interleaved and to thereby eliminate the need to incorporate costly memory subsystem designs such as interleaving into the system.

It is also an object of this invention to enable flash memory to operate using an optimal pipelined architecture wherein the reading of separate banks of flash memory is interleaved and to thereby support back to back burst read cycles and thus ensure that cache line fills are performed in a quick and optimal fashion.

A memory device having a memory array is described. The memory device has a sensing stage to sense data stored within the memory array. The memory device also has an output stage to output the data stored within the memory array sensed by the sensing stage. The sensing stage and the output stage are separated so that data associated with a first address within the memory array is sensed while data associated with a second address within the memory array is output.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
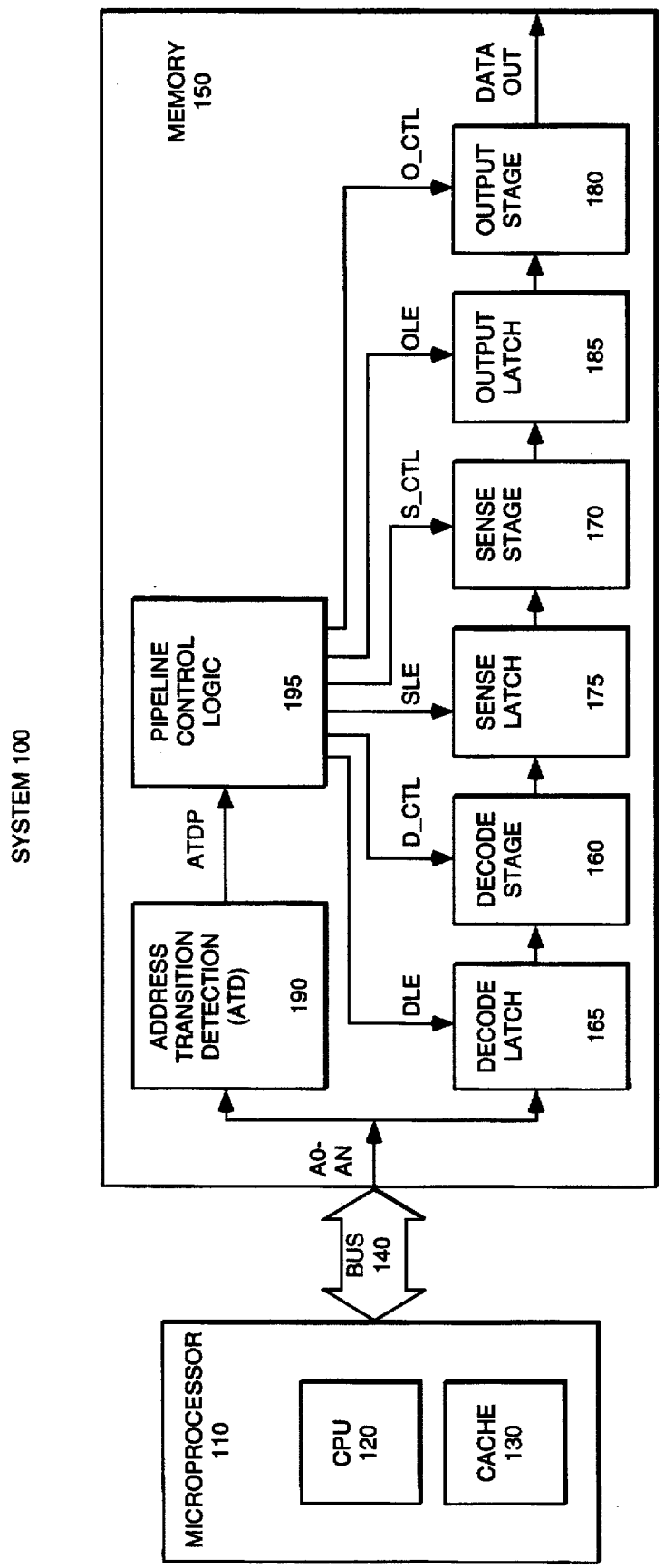
FIG. 1 illustrates a computer system having a microprocessor that is coupled by a high speed bus to a memory device having a pipelined read architecture.

FIG. 1 illustrates a computer system 100 wherein microprocessor 110 is coupled to memory 150 by high speed bus 140. Microprocessor 110 includes central processing unit (CPU) 120 and cache 130. Cache 130 stores frequently used data and instructions so that they can be accessed by CPU 120. Microprocessor 110 has a burst read mode, wherein bus 140 is used to retrieve bursts of data or instructions from memory 150 to fill one or more cache lines of cache 130. The operation of microprocessors and burst accesses across high speed buses is well understood in the art and will not be described further except as they relate to the operation of the pipelined read architecture of memory 150.

Alternately, microprocessor 110 can be replaced by any device that performs burst read accesses to memory 150. Examples of such devices include external cache memories and direct memory access (DMA) devices.

If the clock frequency by which microprocessor 110 operates is increased, the burden placed on memory 150 to provide data and instructions to microprocessor 110 is also increased. For optimal performance of system 100, the read access time for memory 150 should decrease when the operating frequency of microprocessor 150 is increased. Memory device 150 uses a pipelined read architecture to decrease overall code and data burst read access times from memory device 150.

A pipelined architecture for memory 150 decreases the delay time associated with a burst read access cycle. Burst read accesses to memory 150 are satisfied at a higher speed than would be the case if memory 150 did not have a pipelined read architecture. Therefore, microprocessor 110 has to wait for fewer clock cycles before needed data or instructions stored in memory 150 can be supplied to CPU 120 thereby permitting CPU 120 to resume operation. The pipelined read architecture of memory 150 therefore permits memory 150 to be used effectively as an execute in place memory.

For one embodiment of computer system 100, memory 150 is flash memory that is being used to replace some, if not all, of volatile main memory (not shown). Thus, flash memory 150 is used in lieu of volatile main memory such as dynamic random access memory (DRAM) or static random access memory (SRAM) to provide a high speed non-volatile main memory for computer system 100.

Alternately, memory 150 is not flash memory, but another kind of memory that is to be accessed by microprocessor 110 using burst accesses, but that previously could not support zero wait state back-to-back burst cycles (e.g. read-only memory (ROM), programmable ROM (PROM), erasable PROM (EPROM), electrically erasable PROM (EEPROM)).

It can be seen in FIG. 1 that the read path of memory device 150 has been split internally into a number of pipeline stages. Because of the separate stages of the pipeline, the overall access time to retrieve a block of data from memory device 150 is significantly decreased.

For the embodiment of FIG. 1, the read path of memory 150 is formed by decode stage latch 165, decode stage 160, sensing stage latch 175, sensing stage 170, output stage latch 185 and output stage 180. Thus, the read path of memory device 150 is internally segmented into three parts or stages. In this scheme, the decoding, sensing and output circuits are placed into separate pipeline stages, 160, 170 and 180, respectively. Latches 165, 175 and 185 are placed at the input to each respective pipeline stage to isolate each pipeline stage from its predecessor. Each of the latches 165, 175 and 185 is a master/slave latch that isolates its associated pipeline stage by latching new information in the master and then releasing the previous contents stored in the master from the slave to the pipeline stage with which it is associated. For example, when sensing stage 170 completes sensing for an address, the data sensed associated with that address will be latched in the master part of sense latch 175. At the same time, the data sensed from a previous address that was stored in the master part of sense latch 175 will be shifted to the slave part of sense latch 175 and then be released to output stage 180. Thus, output stage 180 can be providing the data sensed for a first address while sense stage 170 is sensing the data associated with the next address.

Addresses to be read are input to memory device 150 as multi-bit addresses on address signal lines A0 through AN. The addresses to be read are provided to decoding stage latch 165 and to address transition detection (ATD) circuit 190.

When ATD circuit 190 senses a change in one or more values asserted on address signal lines A0 through AN, ATD circuit 190 sends an ATD pulse to pipeline control logic 195. The ATD pulse is sent on signal line ATDP and informs pipeline control logic 195 that a new address to be read is ready to enter the read pipeline of memory 150.

Pipeline control logic 195 is a counter circuit that controls the progress of read operations along the read path of memory device 150. Although the amount of time for a particular stage to complete varies, each stage of the pipeline takes a predetermined amount of time to complete.

When pipeline control logic 195 receives an ATD pulse from ATD circuit 190, pipeline control logic 195 uses decode latch enable signal DLE to cause decode latch 165 to latch the new address. At the same time, the previous address stored in decode latch 165 will be output to decode stage 160. When the previous address is released from decode latch 165, pipeline control logic 195 will use decode control signal line D_CTL to signal decode stage 160 that a new address is to be decoded.

Alternately, there is no decode latch 165 in the pipeline and each new address enters sense stage 170 directly upon receipt of signal D_CTL triggered by the ATD pulse ATDP.

Upon receiving signal D_CTL, decode stage 160 will take a known amount of time to complete the decode of the new address. After this known amount of time has elapsed, pipeline control logic 195 will use sense latch enable signal SLE to cause sense latch 175 to latch the outputs from decode stage 160. Once the outputs from decode stage 160 have been latched in sense latch 175, decode stage 160 will be free to decode the next address when the next address is sensed by ATD circuit 190.

For one embodiment, an external constraint is imposed that addresses for a burst read cannot be specified separated in time less than a certain minimum time period equal to the duration of the longest pipeline stage of the read path. This guarantees that decode stage 160 will always be able to receive the next address.

Alternately, if two addresses are specified too close together in time, pipeline control logic 195 can delay the commencement of the decoding of the second address by decode stage 160 by latching the second address in decode latch 165 until the first address has been decoded.

When the output from decode stage 160 has been latched into sense latch 175 and sense stage 170 is available to sense this decoded location, pipeline control logic 195 will use signal SLE to cause sense latch 175 to release the output from decode stage 160 to sense stage 170. At the same time, pipeline control logic 195 will use sensing control signal S_CTL to cause sense stage 170 to begin sensing the memory array cells associated with the output from sense latch 175.

A known amount of time after pipeline control logic 195 has initiated a sensing operation in sense stage 170, sensing will complete and pipeline control logic 195 will use signal OLE to cause output latch 185 to latch the output from sense stage 170 associated with the address that was sensed.

When the output from sense stage 170 has been latched into output latch 185 and output stage 180 is available, pipeline control logic 195 will use signal OLE to cause output latch 185 to release the output from sense stage 170 to output stage 180. At the same time, pipeline control logic 195 will use output control signal O_CTL to cause output stage 100 to begin providing as output from memory 150 the memory array cell values associated with the output from output latch 185.

A known amount of time after pipeline control logic 195 has initiated an output operation for output stage 180, the provision of output will complete.

For example of the operation of the read path of memory 150, for one embodiment, decoding stage 160 take 15 nanoseconds (nS), sensing stage 170 takes 30 nS and output stage 180 takes 15 nS. For the above pipelined read architecture, using these sample numbers, a warm up time of 60 nS is initially required to fill the pipeline. This is the mount of time that it will take for the first address to be decoded, sensed and then for the data associated with the first address to be output. Once the pipeline stages are filled, the overall delay from the specification of a particular address to the output of data stored at the specified address will remain 60 nS. After the initial warm up delay, however, microprocessor 110 can sample data every 30 nS and can input a new address to memory 150 every 30 nS. Thus after the initial warm up time has elapsed, microprocessor 110 can receive one piece of data every 30 nS.

On the other hand, without a pipelined read path, microprocessor 110 could only input new addresses every 60 nS and could only sample new data every 60 nS. Hence the overall throughput rate of memory device 150 is increased by pipelining the read path. Thus when microprocessor 110 accesses blocks of data from memory device 150, the pipelined read architecture of memory 150 will increase the overall read performance of device 150.

The increased overall data throughput of the pipelined read path architecture of memory device 150 enables memory device 150 to quickly supply data and instructions to microprocessor 110 for execute in place applications. Because microprocessor 110 has an internal cache 130, accesses to memory 150 that are in blocks can be used to fill lines of internal cache 130. In such situations, the system performance of system 100 will be enhanced by the fast burst read accesses from memory 150 provided by the read path pipeline.

In systems that have an external cache, accesses to memory 150 can also be made in blocks. In such systems, the system performance will also be enhanced by the fast burst read accesses from memory 150 provided by the read path pipeline. Furthermore, the pipelined read path enables device 150 to satisfy burst read requests such as DMA transfers more quickly than would be the case if there was no pipelined read path. The overall throughput latency time for such accesses will be decreased if a memory device having a pipelined read path is used.

Figure 2:
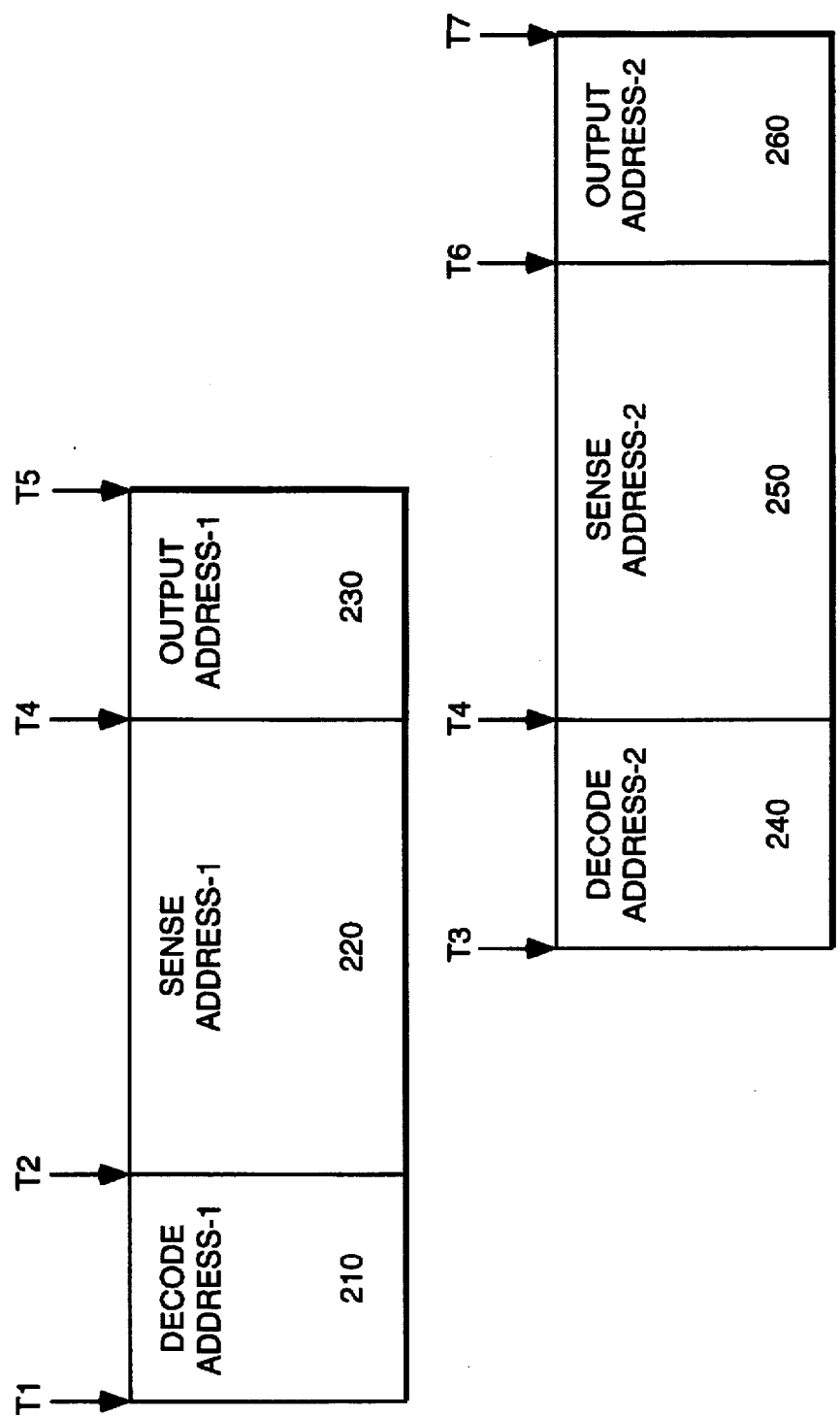
FIG. 2 is a diagram that illustrates the timing for stages of the pipelined read circuitry of FIG. 1 during two consecutive read operations.

FIG. 2 is a diagram that illustrates the timing for stages of the pipelined read circuitry of FIG. 1 during two consecutive read operations. In the example of FIG. 2, sensing takes more time than decoding or output.

A first address (ADDRESS-1) enters the read path pipeline a time T1. Process block 210 illustrates that the decoding of ADDRESS-1 begins at time T1 and completes at time T2. The sensing for ADDRESS-1 then begins at time T2 and ends at time T4 as shown in process block 220.

Because the decode of ADDRESS-1 ended at time T2, the decode stage is ready at time T2 to begin decode of the second address, ADDRESS-2. Because sensing takes longer than decoding, if the decode of ADDRESS-2 began at time T2 when the sensing of ADDRESS-1 began, then the decode output for ADDRESS-2 would be latched until sensing of ADDRESS-1 completed at time T4 and the sensing circuitry was ready to begin sensing for ADDRESS-2.

In FIG. 2, however, the decode of ADDRESS-2 does not begin at time T2 but is delayed instead until time T3 so that the decoding of ADDRESS-2 will complete at time T4 as shown by process block 240. Time T4 is the time that the sensing of ADDRESS-1 completes, therefore, the output of the data associated with ADDRESS-1 will begin at time T4 and the sensing of data associated with ADDRESS -2 can also begin at time T4 as shown by process block 250.

As shown by process block 230, the output of data associated with ADDRESS-1 begun at time T4 will complete at time T5. The sensing of data associated with ADDRESS-2 (process block 250) also begun at time T4 will complete at time T6. Then, as shown by process block 260, the output of data associated with ADDRESS-2 will begin at time T6 and will complete at time T7.

Note that as soon as the decoding of ADDRESS-2 completes at time T4, it is possible for a third address to enter the read path pipeline and the read data burst can continue.

Also note that if the read path was not pipelined, the decoding of ADDRESS-2 could not begin until the data associated with ADDRESS-1 had completed at time T5. Thus, without a pipelined read path, the output of data associated with ADDRESS-2 would not complete until a time period (equal to T5 minus T3) beginning at time T7 had elapsed.

It may be the case, however, that two stages of the read path pipeline are dependent upon each other in such a way that they cannot be divorced from one another. Decoding determines what area (row and column) of the memory matrix is going to be accessed. Then, during sensing, the data to be read is retrieved from the memory matrix. Thus, for example, the sensing stage may depend on the decoding stage so that the decoding of an address cannot begin until the sensing of a previous address has completed.

For one embodiment, an address transition detection (ATD) scheme is built into the sensing stage in such a way that decoding for one address cannot be performed while a previously specified address is being sensed. For this embodiment, immediately upon detecting an address transition, the output of the sense amplifiers of the sense stage is equalized. This sense amplifier output equalization occurs while the address to be read is being decoded. Then, during the sensing stage, one waits for the cell current to either pull the output of the sense amplifier down, or, if there is no current, circuit loads will pull the output from the sense amplifier up. In this scheme, the ATD pulse is set so that the ATD pulse has a duration exactly, or very close to, the amount of time that it takes to decode and sense. Therefore, when the ATD pulse ends, the sense amplifiers have already sensed data and whatever data is at the output of the sense amplifiers can be latched.

For this embodiment, one cannot start decoding an address when a previous address is sensing because the ATD pulse actually begins when the address changes. Thus, as soon as the address changes, another ATD pulse begins, and if the sensing has not completed, there will be problems. This is because, under this scheme, one of the first things that the ATD pulse does is to cause a shorting of the output of the sense amplifiers. Therefore, if the output of a sense amplifier was starting to go low or high from the previous address before the output gets latched, the output will short the sense amplifier output. Therefore, under this scheme, one must wait until the output data has been latched before another address can be specified.

Figure 3:
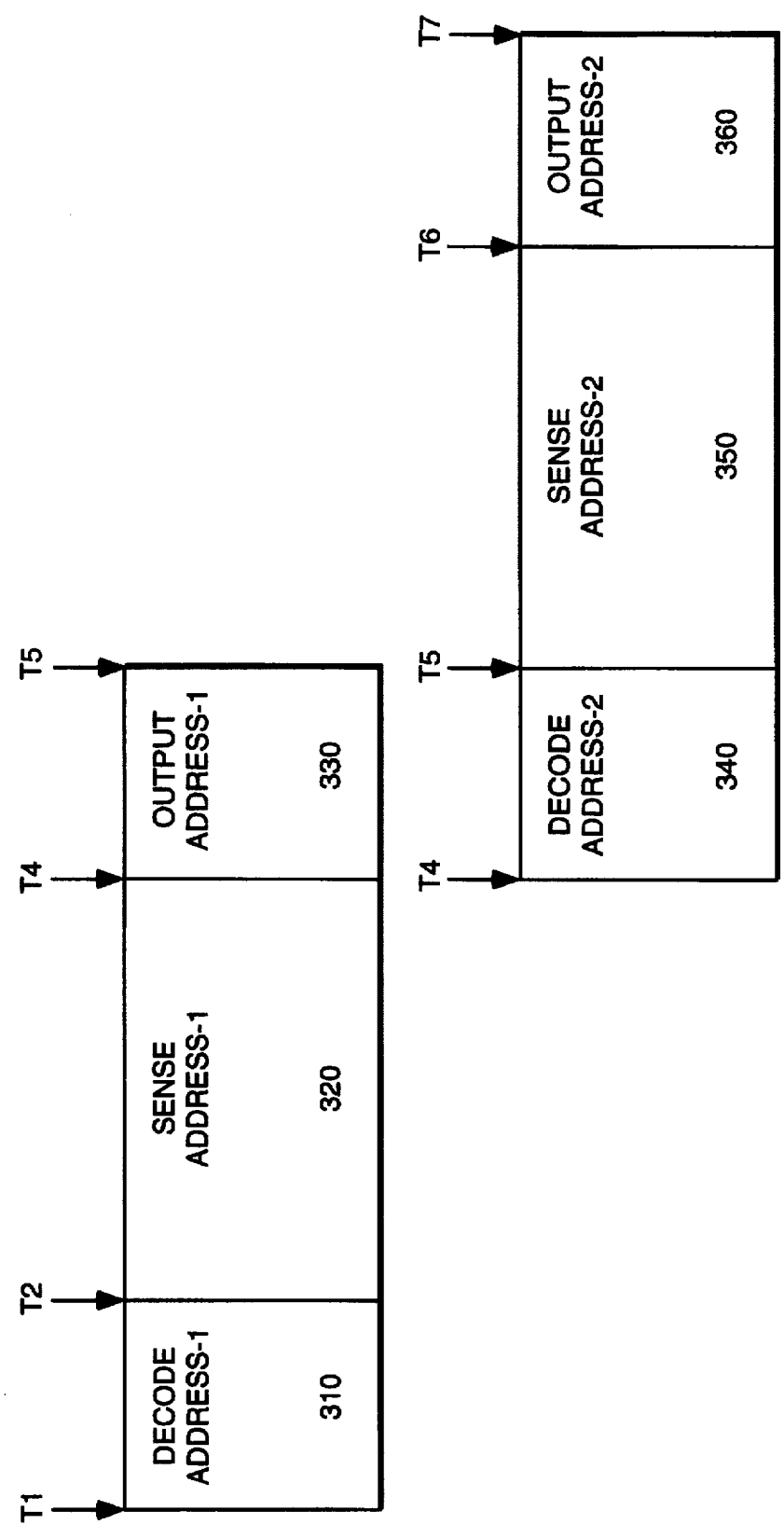
FIG. 3 is a diagram that illustrates the timing for stages of the pipelined read circuitry of FIG. 1 during two consecutive read operations wherein the decode stage for an address cannot begin until the sensing stage for a previous address has completed.

FIG. 3 is a diagram that illustrates the timing for stages of the pipelined read circuitry of FIG. 1 during two consecutive read operations wherein the decode stage for an address cannot begin until the sensing stage for a previous address has completed. In the example of FIG. 3, sensing takes more time than decoding or output.

A first address (ADDRESS-1) enters the read path pipeline a time T1. Process block 310 illustrates that the decoding of ADDRESS-1 begins at time T1 and completes at time T2. The sensing for ADDRESS-1 then begins at time T2 and ends at time T4 as shown in process block 220.

Because the decode of ADDRESS-1 ended at time T2, the decode stage would normally be ready at time T2 to begin decode of the second address, ADDRESS-2. As explained previously, however, because sensing is tied to decoding for this embodiment, if the decode of ADDRESS-2 began at time T2, then the sense amplifiers could be shorted when the sensing of ADDRESS-1 began, thereby damaging the sensing circuitry.

In FIG. 3, however, the receipt and subsequent decode of ADDRESS-2 does not begin at time T2 but is delayed until time T4. This permits the decoding of ADDRESS-2 to begin at time T4 and complete at time T5 as shown by process block 340. Time T4 is the time that the sensing of ADDRESS-1 completed, therefore, the output of the data associated with ADDRESS-1 will begin at time T4 and the decoding of ADDRESS -2 can also begin at time T4 as shown by process block 340.

As shown by process block 230, the output of data associated with ADDRESS-1 begun at time T4 will complete at time T5. The sensing of data associated with ADDRESS-2 (process block 350) will also begin at time T5 and will complete at time T6. Then, as shown by process block 360, the output of data associated with ADDRESS-2 will begin at time T6 will complete at time T7.

Note that as soon as the sensing of ADDRESS-2 completes at time T6, a third address can enter the read path pipeline and the read data burst can continue. Also note that if the read path was not pipelined, the decoding of ADDRESS-2 could not begin until the data associated with ADDRESS-1 had completed at time T5. Thus, if there was no pipelining the output of data associated with ADDRESS-2 would not complete until a time period (equal to T5 minus T4) beginning at time T7 had elapsed.

Figure 4:
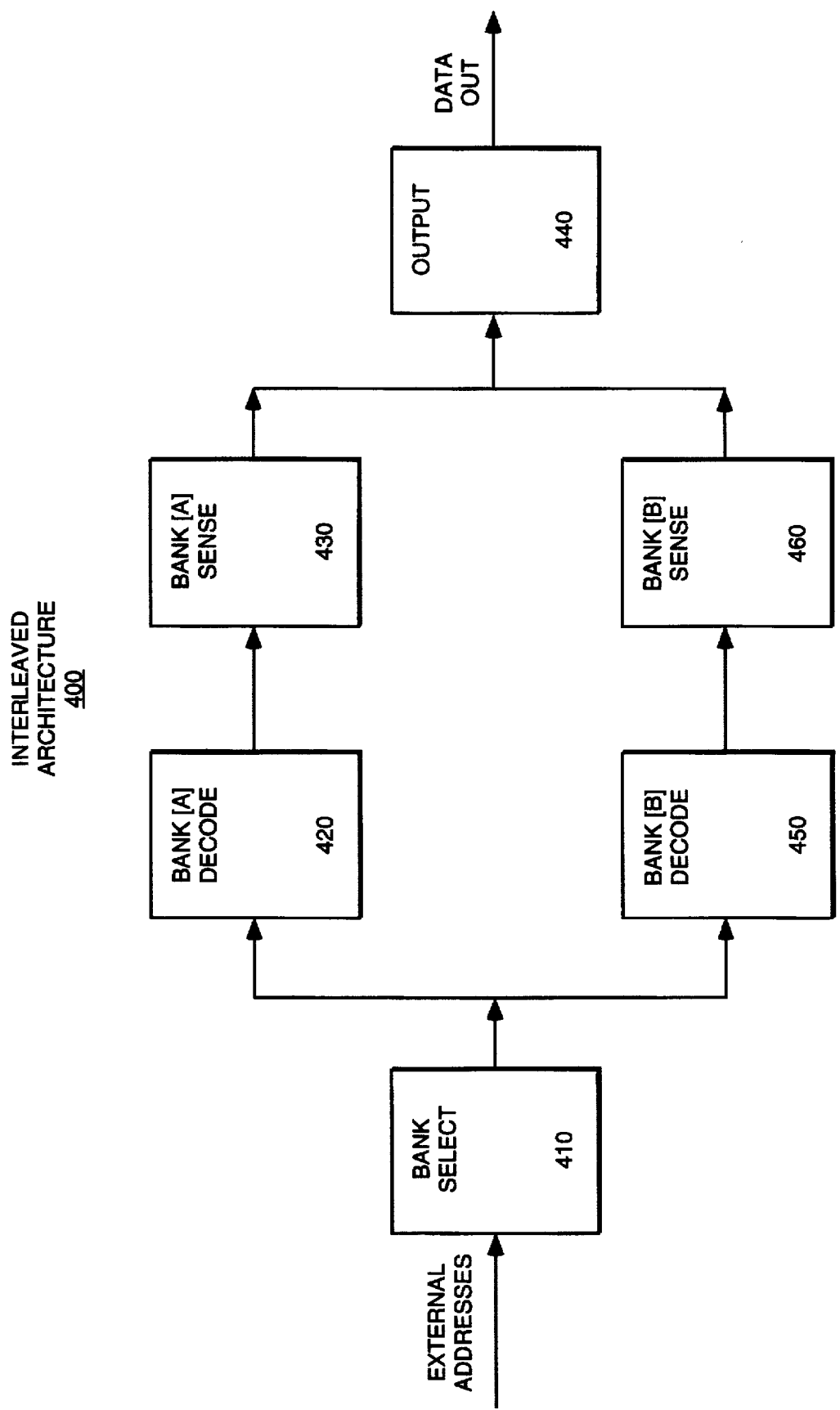
FIG. 4 illustrates a flash memory having two banks of memory and separate pipelined read circuitry for each bank.

Although FIG. 1 depicts a single read path, faster burst read operations can be performed if the memory array is divided into two or more banks and if the addresses of the data burst alternate between (or among) the separate banks. FIG. 4 illustrates a flash memory having two banks of memory and separate pipelined read circuitry for each bank.

In FIG. 4 the memory array has been divided into two banks of memory, bank [A] and bank [B]. Although banks [A] and [B] are part of the same integrated circuit, they are isolated to the extent that each bank can be read while the other bank is also being read. Bank select circuitry 410 receives external addresses representing memory locations to be accessed from banks [A] and [B]. If the external address is a bank [A] address, bank select circuitry 410 dispatches the bank [A] address to the read pipeline for bank [A] to initiate an access to the memory location associated with the dispatched bank [A] address. If, on the other hand, the external address is a bank [B] address, bank select circuitry 410 dispatches the bank [B] address to the read pipeline for bank [B] to initiate an access to the memory location associated with the dispatched bank [B] address.

Decode and sensing for bank [A] can be performed while decode and sensing for bank [B] is being performed. Therefore, bank [A] decode stage 420 and bank [A] sense stage 430 can be reading a bank [A] address at the same time that bank [B] decode stage 450 and bank [B] sense stage 460 are reading a bank [B] address.

By staggering accesses to banks [A] and [B] and alternating between the banks, output stage 440 can be shared by the read pipelines of both banks.

For an embodiment wherein external addresses are binary integers, bank select circuitry 410 can identify even or odd addresses based on the least significant bit of the external address. For this embodiment, bank [A] will hold data belonging to even addresses and bank [B] will hold data belonging to odd addresses. Thus, an external address having a least significant bit that has the value of zero, will be deemed an even address and dispatched to bank [A]. On the other hand, an external address having a least significant bit that has the value of one, will be deemed an odd address and dispatched to bank [B]. Note that because the least significant bit of the external address is used to select between the banks [A] and [B], the information contained within the least significant bit of the external address is implicit within even and odd addresses. Therefore, the bank [A] and [B] addresses can be expressed using one less bit than is required to express the external address.

Throughout this description the conventions "odd" and "even" will be used interchangeably to describe banks [A] and [B], respectively, and to describe how bank select circuitry 410 discriminates between addresses for bank [A] and addresses for bank [B]. It is to be understood, however, that alternate conventions and bank determination algorithms can be employed by bank select circuitry 410. For example, for an embodiment wherein bank select circuitry 410 discriminates between banks [A] and [B] using the most significant bit of the external address, then a "high" and "low" address naming convention would be more appropriate than that of "even" and "odd". In such a case, rather than even and odd addresses being used to determine whether to access even or odd banks, high and low addresses would be used to determine whether to access high or low banks.

Moreover, the memory array can be separated into more than two banks. If four banks were used, the banks could simply be named banks one through four (or banks A through D). In one embodiment, the two least significant bits of the external address could be used to determine which of the four banks contains the location to be accessed as specified by a particular external address. Alternately, two or more non-contiguous bits of the external address can be used to identify the bank to be accessed. Thus, for example, the most and least significant bits of the external address can be combined and used to select among high-odd, high-even, low-odd and low-even banks.

As was the case in FIG. 1, for the embodiment depicted in FIG. 4, each external address is provided asynchronously to bank select circuitry. Address transition detection circuitry within bank select circuitry 410 then detects when a new external address has been specified. Alternately, a single external address is provided to bank select circuitry 410 and, based upon this address, a counter circuit internal to bank select circuitry 410 calculates the succeeding addresses of a data burst. These succeeding addresses are then provided by bank select circuitry 410 one at a time to the read pipelines of alternating banks when the banks are ready to receive them.

Alternately, each external address is provided synchronously to memory 150 (FIG. 1) from bus 140 (FIG. 1) accompanied by an address strobe ADS# signal on the rising edge of a pulse from clock signal. For yet another alternate embodiment, a single external address is provided to bank select circuitry 410 and, based upon this address, a counter circuit internal to bank select circuitry 410 calculates the succeeding addresses of a data burst. These succeeding addresses are then provided to bank select circuitry 410 one at a time on successive clock pulses from the clock signal.

For still other alternate embodiments, the external address, is formed by multiplexed addresses. For example, a single address can be formed from a row and column address pair that are multiplexed on a common set of address lines and are accompanied respectively by row and column address strobe signals. The row and column addresses can be strobed into bank select circuitry 410 asynchronously. Alternately, the row and column addresses can be accompanied by a clock signal and strobed into bank select circuitry 410 synchronously.

Figure 5:
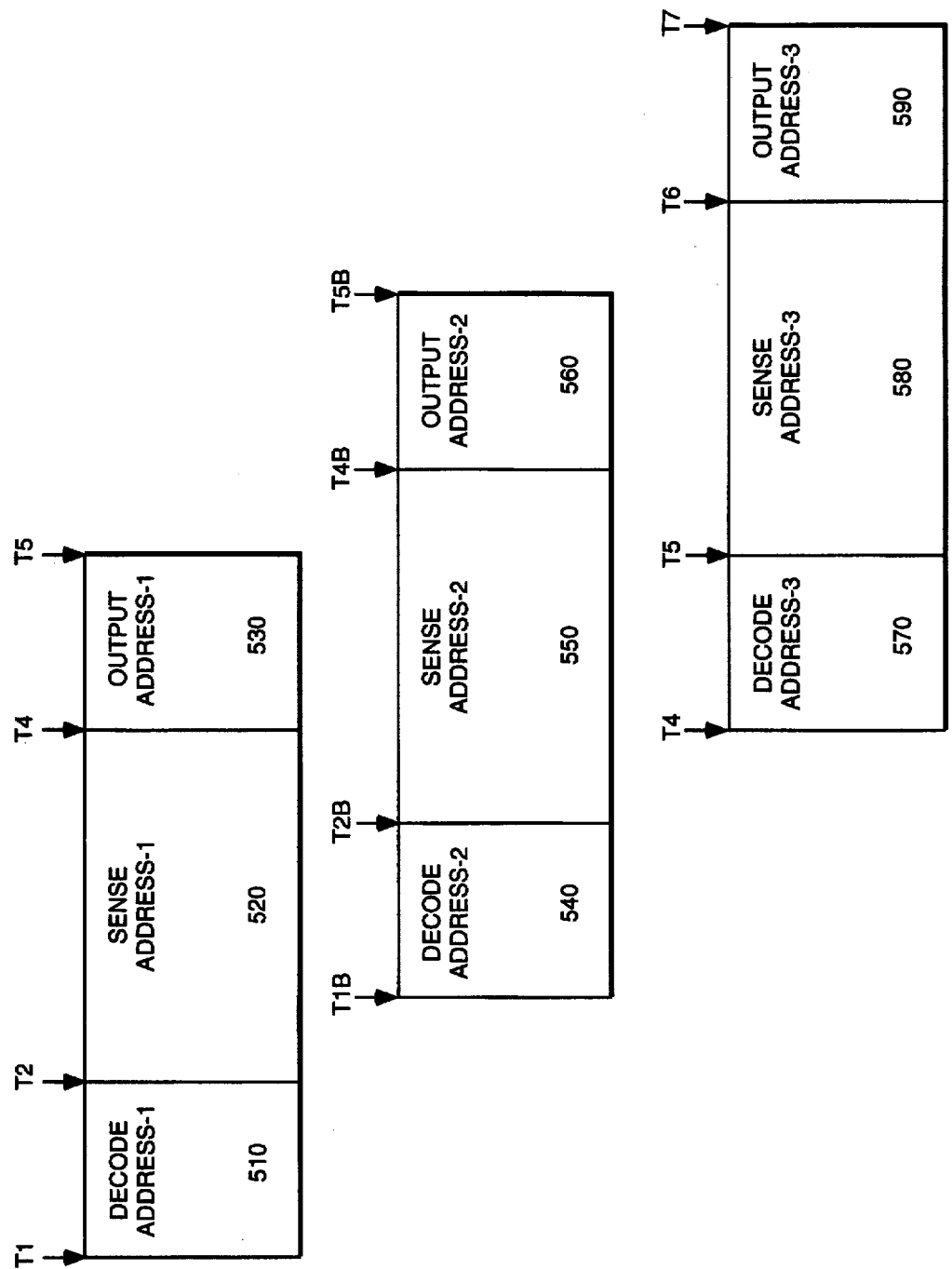
FIG. 5 is a diagram that illustrates the timing for stages of the two bank pipelined read circuitry of FIG. 4 during three consecutive read operations wherein the read operations alternate between the banks of memory.

FIG. 5 is a diagram that illustrates the timing for stages of the pipelined read circuitry of FIG. 4 during three consecutive read operations wherein the read operations alternate between the two banks of memory. Thus, in FIG. 5, a read access to ADDRESS-1 of bank [A] begins at time T1. Then, a read access to ADDRESS-2 of bank [B] begins at time T1A. This is followed by a read access to ADDRESS-3 of bank [A] that begins at time T4.

As was the case in FIG. 3, in FIG. 5 during two consecutive read operations to the same bank, the decode stage for an address cannot begin until the sensing stage for the previous address has completed. Alternately, the sensing stage for a bank will not depend upon the decode stage for the bank.

In FIG. 5, a first address (bank [A] address ADDRESS-1) enters the bank [A] read path pipeline at time T1. Process block 510 illustrates that the decoding of ADDRESS-1 of bank [A] begins at time T1 and completes at time T2. The sensing for ADDRESS-1 of bank [A] then begins at time T2 and ends at time T4 as shown in process block 520.

Because the decode of ADDRESS-1 of bank [A] ended at time T2, for the embodiment wherein the sensing stage does not depend upon the decode stage, the decode stage of bank [A] would be ready at time T2 to begin decode of the second bank [A] address, ADDRESS-3. As explained previously, however, for the embodiment depicted in the figure, sensing within a particular bank is tied to decoding for the bank. Therefore, if the decode of ADDRESS-3 of bank [A] began at time T2, then the sense amplifiers of bank [A] could be shorted when the sensing of ADDRESS-3 began. This would thereby damage the bank [A] sensing circuitry.

In FIG. 5, however, the receipt and subsequent decode of ADDRESS-3 of bank [A] does not begin at time T2 but instead is delayed until time T4. That way the decoding of ADDRESS-3 of bank [A] will begin at time T4 and complete at time T5 as shown by process block 570. Time T4 is the time that the sensing of ADDRESS-1 of bank [A] completed, therefore, the output of the data associated with ADDRESS-1 of bank [A] will begin at time T4 and the decoding of ADDRESS-3 of bank [A] can also begin at time T4 as shown by process block 570.

As shown by process block 530, the output of data associated with ADDRESS-1 of bank [A] begun at time T4 will complete at time T5. The sensing of data associated with ADDRESS-3 of bank [A] (process block 580) will also begin at time T5 and will complete at time T6. Then, as shown by process block 590, the output of data associated with ADDRESS-3 of bank [A] will begin at time T6 will complete at time T7.

Meanwhile, between the dispatch of ADDRESS-1 and ADDRESS-3 to the read path of bank [A], an access to ADDRESS-2 of bank [B] is initiated at time T1A. Because banks [A] and [B] are isolated from one another, ADDRESS-2 of bank [B] can be read or sensed at the same time that bank [A] is reading or sensing addresses ADDRESS-1 or ADDRESS-2 of bank [A]. Because banks [A] and [b] share a common output stage, however, time T1A is a time that has been staggered between the beginning of the read of bank [A] address ADDRESS-1 at time T1 and the beginning of the read of bank [A] address ADDRESS-3 at time T4. The staggering is done so that the output of the data at bank [B] address ADDRESS-2 can be performed between the termination of the output of the data for bank [A] address ADDRESS-1 at time T4 and the beginning of the output of data for bank [A] address ADDRESS-3 at time T6.

Note that as soon as the sensing of ADDRESS-2 of bank [B] completes at time T5B, a second bank [B] address can enter the bank [B] read path pipeline and the read data burst can continue.

Also note that if the read path for banks [A] and [B] were not separate and interlaced, the decoding of ADDRESS-2 could not begin until the data associated with ADDRESS-1 had completed at time T5. Thus, the output of data associated with ADDRESS-2 would not complete until a time period (equal to T5 minus T4) beginning at time T7 had elapsed. Thus, by dividing the memory array into two banks with separate pipelines for each bank, the throughput of data for data burst reads is doubled over the throughput that would be realized using a single pipelined read path so long as the reads alternate between the two banks. It follows that by introducing four separate banks and pipelines and interlacing among them, the throughput of data for data burst reads is quadrupled over the throughput that would be realized using a single pipelined read path so long as the reads alternate among the four banks. In general, by introducing N separate banks and pipelines and interlacing among them, the throughput of data for data burst reads is will increase by a factor of N over the throughput that would be realized using a single pipelined read path so long as the reads alternate among the four banks.

Figure 6:
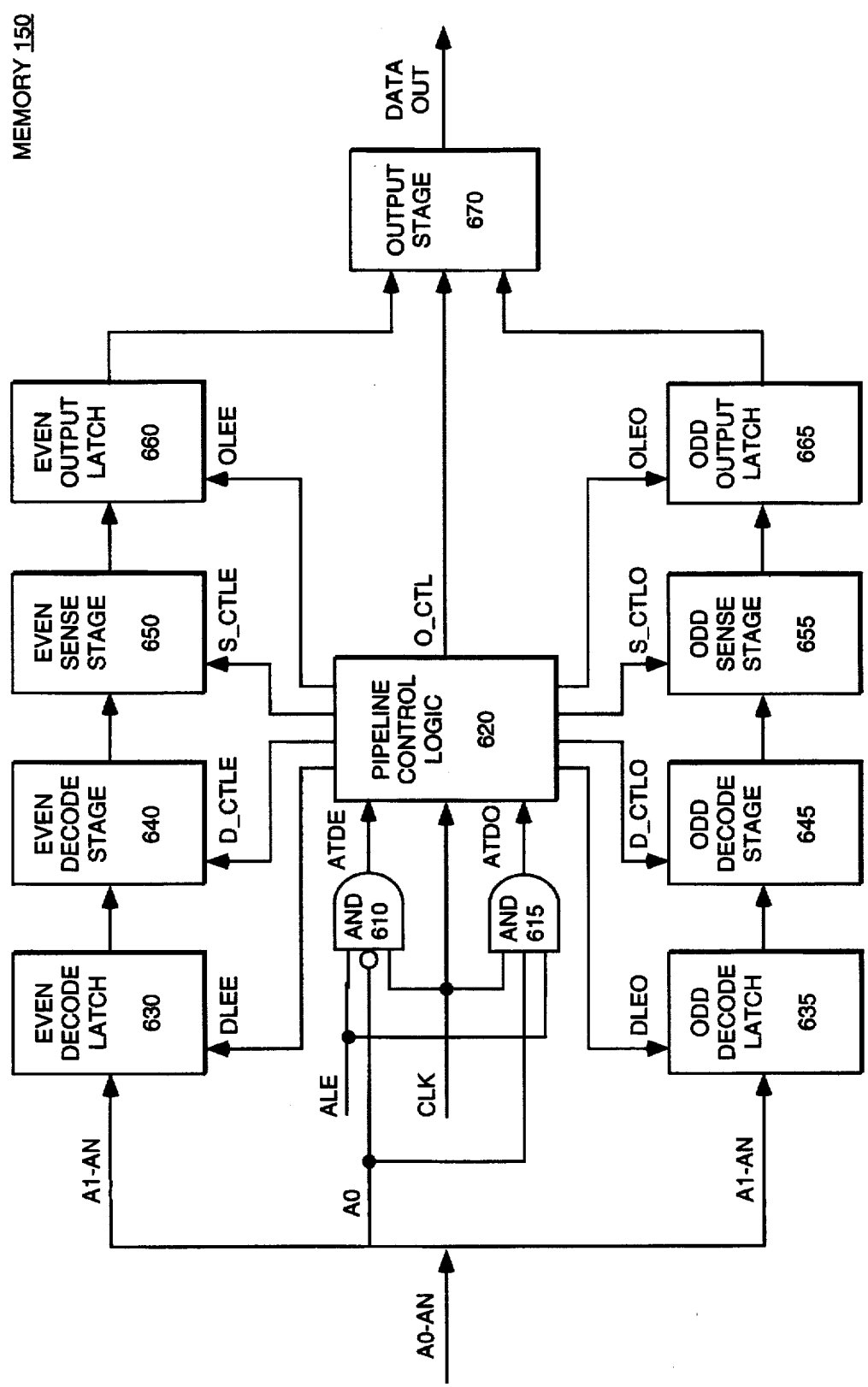
FIG. 6 illustrates a flash memory having two banks of memory and separate pipelined read circuitry for each bank wherein the pipelines operate under the control of a clock signal.

FIG. 6 illustrates a flash memory having two banks of memory and separate pipelined read circuitry for each bank wherein the pipelines operate under the control of a clock signal In FIG. 6, signals A0–AN, representing a multi-bit external address, enter memory 150 on the rising edge of clock signal CLK accompanied by the assertion of address latch enable signal ALE. Clock signal CLK and address latch enable signal ALE are both input to AND gates 610 and 615. Signal A0, representing the low order bit of the external address, is provided as an input to AND gate 615. The complement of signal A0 is provided as an input to AND gate 610. Thus, if the external address is an even address, AND gate 610 will provide even address transition detection pulse ATDE to pipeline control logic 620. On the other hand, if the external address is an odd address, AND gate 615 will provide odd address transition detection pulse ATDO to pipeline control logic 620.

Pipeline control logic 620 also receives clock signal CLK as an input and uses the clock signal to control the timing of the even and odd read pipelines of memory 150. Therefore, when pipeline control logic 620 receives an even ADT pulse, pipeline control logic 620 will use even decode latch enable control signal DLEE to cause the values asserted on address signal lines A1–AN to be captured by even decode latch 630. Pipeline control logic 620 will then use control signals D_CTLE, S_CTLE, OLEE and O_CTL, respectively, to control the flow through even decode stage 640, even sense stage 650, even output latch 660 and output stage 670 of the even pipeline.

On the other hand, when pipeline control logic 620 receives an odd ADT pulse, pipeline control logic 620 will use odd decode latch enable control signal DLEO to cause the values asserted on address signal lines A1–AN to be captured by odd decode latch 635. Pipeline control logic 620 will then use control signals D_CTLO, S_CTLO, OLEO and O_CTL, respectively, to control the flow through odd decode stage 645, even sense stage 655, even output latch 665 and output stage 675 of the odd pipeline.

The diagram of FIG. 5 can illustrate the timing for stages of the pipelined read circuitry of FIG. 6 during three consecutive read operations wherein the read operations alternate between the two banks of memory. In FIG. 5, the three data burst read would begin at time T1 with the provision of odd address ADDRESS-1 accompanied with signal ALE on the rising edge of a first pulse of clock signal CLK.

At time T1B, the second clock pulse of clock signal CLK would begin with the provision of even address ADDRESS-2 accompanied with signal ALE on the rising edge of the second pulse.

At time T4, the third clock pulse of clock signal CLK would begin with the provision of odd address ADDRESS-3 accompanied with signal ALE on the rising edge of the third pulse. Also on the rising edge of the third clock pulse, the output of the data stored at the location corresponding to odd address ADDRESS-1 would be provided as output from the memory device.

At time T4B, the fourth clock pulse of clock signal CLK would begin with the output of the data stored at the location corresponding to even address ADDRESS-2 being provided as output from the memory device. Also, if the data burst was to continue, a next even address could be provided accompanied with signal ALE on the rising edge of the fourth clock pulse.

At time T6, the fifth clock pulse of clock signal CLK would begin with the output of the data stored at the location corresponding to odd address ADDRESS-3 being provided as output from the memory device. Also, if the data burst was to continue, a next odd address could be provided accompanied with signal ALE on the rising edge of the fifth clock pulse.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. A memory device comprising:
    a first memory bank;
    a second memory bank;
    a first read path comprising:
        a first decoding stage for decoding addresses associated with the first memory, bank;
        a first sensing stage coupled to sense data from the first memory bank in accordance with addresses decoded by the first decoding stage;
    a second read path comprising:
        a second decoding stage for decoding addresses associated with the second memory bank;
        a second sensing stage coupled to sense data from the second memory bank in accordance with addresses decoded by the second decoding stage;
    an address transition detection circuit that detects a transition from a first address to a second address, wherein the address transition detection circuit causes equalization of the first sensing stage upon detection of addresses for the first memory bank, wherein the address transition detection circuit causes equalization of the second sensing stage upon detection of addresses for the second memory bank;
    a bank select, wherein responsive to the first address the bank select provides at least a portion of the first address to the first read path, wherein responsive to the second address the bank select provides at least a portion of the second address to the second read path, wherein decoding and sensing on the first memory bank is performed while decoding and sensing on the second memory bank is performed.

2. The memory device of claim 1, wherein a least significant bit of a given address determines whether the given address is associated with one of the first memory bank and the second memory bank.

3. The memory device of claim 1, wherein a most significant bit of a given address determines whether the given address is associated with one of the first memory bank and the second memory bank.

4. The memory device of claim 1 wherein the first and second memory banks further comprise flash memory cells.

5. A memory device comprising:
    a plurality of memory banks;
    a plurality of read paths, each having an associated memory bank of the plurality of memory banks, comprising:
        a decoding stage for decoding addresses associated with the associated memory bank;
        a sensing stage coupled to sense data from the associated memory bank in accordance with addresses decoded by the decoding stage;
    an address transition detection circuit providing an ATD signal in response to a transition from a first address to a second address, wherein the sensing stage associated with the memory bank associated with the second address is equalized in response to the ATD signal;
    a bank select for selecting one of the plurality of read paths, wherein responsive to the first address the bank select provides at least a portion of the first address to a first selected one of the plurality of read paths; wherein responsive to the second address the bank select provides at least a portion of the second address to a second selected one of the plurality of read paths, wherein decoding and sensing of the first selected one of the plurality of memory banks is performed while decoding and sensing of the second selected one of the plurality of memory banks is performed.

6. The memory device of claim 5, wherein a plurality of contiguous least significant bits of a given address determines which read path is associated with the given address.

7. The memory device of claim 5, wherein a plurality of non-contiguous bits of a given address determines which read path is associated with the given address.

8. The memory device of claim 5 wherein at least some memory banks of the plurality of memory banks comprises flash memory.

9. A method for reading a memory device having a plurality of memory banks, comprising the steps of:
    a) detecting an address transition from a previous address to a new address;
    b) selecting a first read path associated with a first memory bank identified by the previous address;
    c) equalizing a sense stage of a second read path in response to the address transition, wherein the second read path is associated with a second memory bank identified by the new address;
    d) reading previously requested data associated with the previous address from the first read path;
    e) selecting the second read path in response to the address transition;
    f) reading newly requested data associated with the new address from the second read path, wherein the second memory bank is read while the first memory bank is being read;
    g) outputting the previously requested data; and
    h) outputting the newly requested data.

10. The method of claim 9, wherein a plurality of contiguous least significant bits of a given address determines which read path is associated with the given address.

11. The method of claim 9, wherein a plurality of non-contiguous bits of a given address determines which read path is associated with the given address.

12. The method of claim 9, wherein some memory banks of the plurality of memory banks comprise flash memory cells.

* * * * *